United States Patent
Yasusaka

(10) Patent No.: US 10,175,714 B2
(45) Date of Patent: Jan. 8, 2019

(54) ENABLE SIGNAL GENERATION CIRCUIT

(71) Applicant: ROHM Co., LTD., Kyoto (JP)

(72) Inventor: Makoto Yasusaka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/722,249

(22) Filed: Oct. 2, 2017

(65) Prior Publication Data

US 2018/0095493 A1  Apr. 5, 2018

(51) Int. Cl.
| | |
|---|---|
| *G11C 7/00* | (2006.01) |
| *G06F 1/04* | (2006.01) |
| *H02M 1/36* | (2007.01) |
| *H03K 5/01* | (2006.01) |
| *H03K 3/012* | (2006.01) |
| *H03L 7/24* | (2006.01) |
| *H03K 3/037* | (2006.01) |
| *H03K 5/08* | (2006.01) |
| *G06F 1/26* | (2006.01) |
| *G06F 1/32* | (2006.01) |

(52) U.S. Cl.
CPC .................. *G06F 1/04* (2013.01); *G06F 1/26* (2013.01); *G06F 1/3203* (2013.01); *G06F 1/3234* (2013.01); *H02M 1/36* (2013.01); *H03K 3/012* (2013.01); *H03K 3/037* (2013.01); *H03K 5/01* (2013.01); *H03K 5/08* (2013.01); *H03L 7/24* (2013.01)

(58) Field of Classification Search
CPC ............ G06F 1/04; G06F 1/26; G06F 1/3203; G06F 1/3234; H02M 1/36
USPC ......................................................... 365/156
See application file for complete search history.

(56) References Cited

U.S. PATENT DOCUMENTS

| | | | |
|---|---|---|---|
| 2008/0007323 A1* | 1/2008 | Caplan ............... | H03K 19/0013 327/536 |
| 2011/0074373 A1* | 3/2011 | Lin ....................... | H02M 3/156 323/282 |
| 2016/0103158 A1* | 4/2016 | Gravati .................. | G01R 19/04 324/103 P |

* cited by examiner

*Primary Examiner* — Anthan Tran
(74) *Attorney, Agent, or Firm* — Chip Law Group

(57) ABSTRACT

Disclosed herein is an enable signal generation circuit. The circuit includes: an enable input terminal that receives an enable input voltage; an enable detection circuit that determines whether the enable input voltage is higher than a first reference voltage, and then outputs an inverted signal; and an output section that is connected to the enable detection circuit. The enable detection circuit is formed of at least two transistors arranged in a differential configuration, gives the two transistors offset voltages that provide different operating voltages, and causes the output section to output a signal based on the inverted signal.

14 Claims, 4 Drawing Sheets

ENABLE SIGNAL GENERATION CIRCUIT

BACKGROUND

CROSS REFERENCE TO RELATED APPLICATIONS

This US. Application claims priority benefit of Japanese Patent Application No. JP 2016-196423 filed in the Japan Patent Office on Oct. 4, 2016. Each of the above-referenced applications is hereby incorporated herein by reference in its entirety.

The present invention relates to an enable signal generation circuit, and more particularly, to an enable signal generation circuit that generates an enable signal for switching between a normal mode and a standby mode.

In a system capable of switching to a standby mode, an operating mode is set in accordance with an input signal for changing the operating mode. Therefore, such a system often incorporates a detection circuit section for comparing the signal level of an enable signal with a predetermined reference signal.

For example, an integrated circuit depicted in FIG. 1 of Japanese Patent Laid-Open No. 2013-171914 (hereinafter, referred to as Patent Document 1) includes an enable terminal for receiving an enable signal, an internal circuit, an enable detection circuit, and a power interruption circuit. The internal circuit has a normal operation mode and a low power consumption mode. The enable detection circuit determines whether or not the voltage level of the enable signal is higher than a first reference voltage. If the voltage level of the enable signal is higher than the first reference voltage, the enable detection circuit outputs a signal for switching the internal circuit from the low power consumption mode to the normal operation mode. The power interruption circuit determines whether or not the voltage level of the enable signal is equal to or lower than a second reference voltage. The second reference voltage is lower than the first reference voltage. If the voltage level of the enable signal is equal to or lower than the second reference voltage, the power interruption circuit cuts off a drive current path for driving the enable detection circuit. Further, the enable detection circuit determines whether or not the voltage level of the enable signal is equal to or lower than a third reference voltage. The third reference voltage is intermediate between the first reference voltage and the second reference voltage. If the voltage level of the enable signal is equal to or lower than the third reference voltage, the enable detection circuit outputs a signal for switching the internal circuit from the normal operation mode to the low power consumption mode.

Meanwhile, an integrated circuit depicted in FIG. 1 of Japanese Patent Laid-Open No. 2013-5196 (hereinafter, referred to as Patent Document 2) includes a control input terminal, an enable detection circuit, and a constant current source. The enable detection circuit determines whether or not the voltage level of an enable signal is higher than a reference voltage. If the voltage level of the enable signal is higher than the reference voltage, the enable detection circuit outputs a signal for switching from a lower power consumption mode to a normal operation mode. The enable detection circuit further determines whether or not the voltage level of the enable signal is equal to or lower than the reference voltage. If the voltage level of the enable signal is equal to or lower than the reference voltage, the enable detection circuit outputs a signal for switching from the normal operation mode to the low power consumption mode. The constant current source operates in such a manner that the consumption current does not increase even when a power supply voltage is high.

SUMMARY

However, the enable detection circuit described in Patent Document 1 needs to pull the enable terminal down to a ground potential GND by using a resistor in order to stabilize the enable terminal during an actual use. Therefore, it is anticipated that the consumption current of the enable terminal may adversely increase in proportion to a voltage applied to the enable terminal.

Further, in the case of the enable detection circuit described in Patent Document 2, it is anticipated that the consumption current of the control input terminal may adversely increase in proportion to a voltage applied to the control input terminal.

The present invention has been made in view of the above circumstances, and provides an enable signal generation circuit that reduces a consumption current as compared to the past.

According to the present invention, there is provided an enable signal generation circuit including an enable input terminal and an enable detection circuit. The enable input terminal receives an enable input voltage. The enable detection circuit determines whether the enable input voltage is higher than a first reference voltage, and then outputs an inverted signal. Having an output section connected to the enable detection circuit, the enable detection circuit is formed of at least two transistors arranged in a differential configuration. Further, the two transistors are given offset voltages that provide different operating voltages. The output section outputs a signal based on the inverted signal.

According to an aspect of the present invention, there is provided the enable signal generation circuit that, if the two transistors are bipolar transistors, gives the offset voltages in such a manner as to provide the two bipolar transistors with different emitter-base forward voltages.

According to an aspect of the present invention, there is provided the enable signal generation circuit that sets the offset voltages in such a manner as to provide the bipolar transistors with different emitter areas.

According to an aspect of the present invention, there is provided the enable signal generation circuit that, if the two transistors are metal-oxide semiconductor (MOS) transistors, gives the offset voltages in such a manner as to provide the two MOS transistors with different gate-source threshold voltages.

According to an aspect of the present invention, there is provided the enable signal generation circuit that sets the offset voltages in such a manner as to make the MOS transistors different in at least either gate width or gate length.

The enable signal generation circuit according to the present invention reduces the consumption current as compared to the past.

DETAILED DESCRIPTION OF THE PREFERRED EMBODIMENTS

Embodiments of the present invention will now be described with reference to the accompanying drawings.

Figure 1:
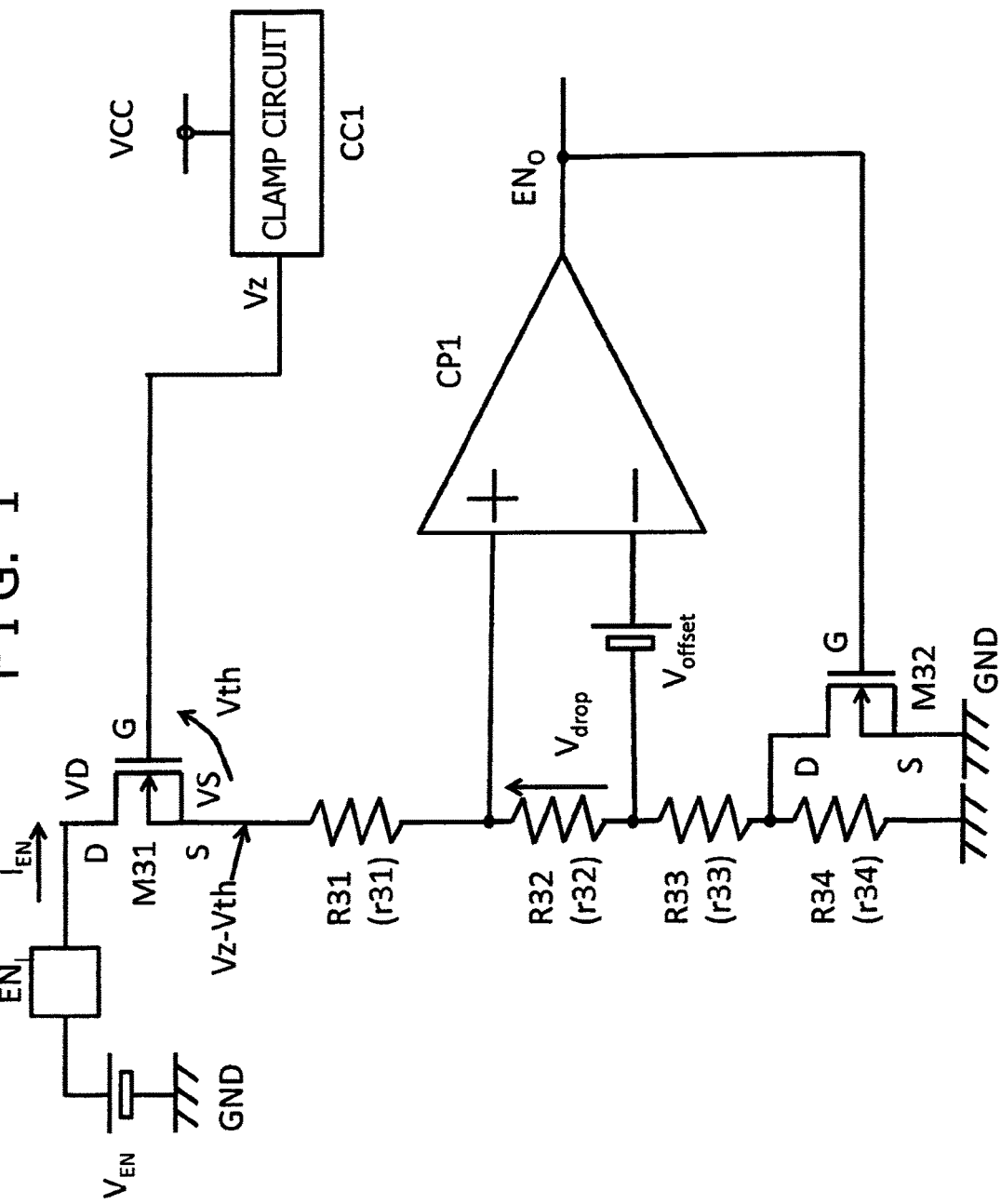
FIG. 1 is a block diagram illustrating a configuration according to an embodiment of the present invention.

FIG. 1 is a block diagram illustrating a configuration according to an embodiment of the present invention.

An enable input terminal ENI to which an enable input voltage VEN is applied is connected to the drain D of a MOS transistor M31. The gate G of the MOS transistor M31 is connected to a clamp circuit CC1. A power supply voltage VCC is supplied to the clamp circuit CC1. The source S of the MOS transistor M31 is connected to one end of a resistor R31. The other end is connected to one end of a resistor R32 and to a non-inverted input terminal+of a comparator CP1. The other end of the resistor R32 is connected to one end of a resistor R33 and to an inverted input terminal−of the comparator CP1. The other end of the resistor R33 is connected to one end of a resistor R34 and to the drain D of a MOS transistor M32. The other end of the resistor R34 is connected to a ground potential GND. The source S of the MOS transistor M32 is connected to the ground potential GND. The output of the comparator CP1 is connected to the gate G of the MOS transistor M32.

While the inverted input terminal−of the comparator CP1 has an offset voltage Voffset, an enable output terminal ENO outputs a LOW L if the enable input voltage VEN applied to the enable input terminal ENI has not reached a predetermined level. When the enable input voltage VEN increases until the voltage Vdrop across the resistor R32 exceeds the offset voltage Voffset, the enable output terminal ENO outputs a HIGH H.

When the power supply voltage VCC is adequately given to the clamp circuit CC1, the MOS transistor M31 is sufficiently on, and its on-resistance, that is, the resistance component between the drain D and source S of the MOS transistor M31, is neglected, the total resistance value r30 between the enable input terminal ENI and the ground potential GND is substantially expressed by the equation $r30=r31+r32+r33+r34.$ Here, the following relationship is established between the drain voltage VD and source voltage VS of the MOS transistor M31 and the enable input voltage VEN:

$VD=VEN, VD=VS$

A consumption current IEN flowing from the enable input terminal ENI to the ground potential GND is then expressed as follows:

$IEN=VEN/r30$

When the enable input voltage VEN is further increased, the enable output terminal ENO goes HIGH H, the MOS transistor M32 turns on, and the resistor R34 shorts. The consumption current IEN is then expressed by the following equation:

$IEN=VEN/(r31+r32+r33)$

In this instance, when the enable input voltage VEN is increased in a situation where the threshold voltage between the gate G and source S of the MOS transistor M31 is Vth and the voltage applied to the gate G is Vz, the source voltage VS of the MOS transistor M31 is clamped to (Vz−Vth), and the consumption current IEN is expressed as follows:

$IEN=(Vz-Vth)/(r31+r32+r33)$

Thus, the dependence of the consumption current IEN on the enable input voltage VEN can be suppressed.

The resistors R31 to R34 according to the present invention form a reference voltage generation circuit. However, the resistors R31 and R33 are not always required. The remaining two resistors R32 and R34 will suffice. Further, a configuration having no hysteresis is included in the present invention. Such a configuration can be established by using only the resistor R32.

Figure 2:
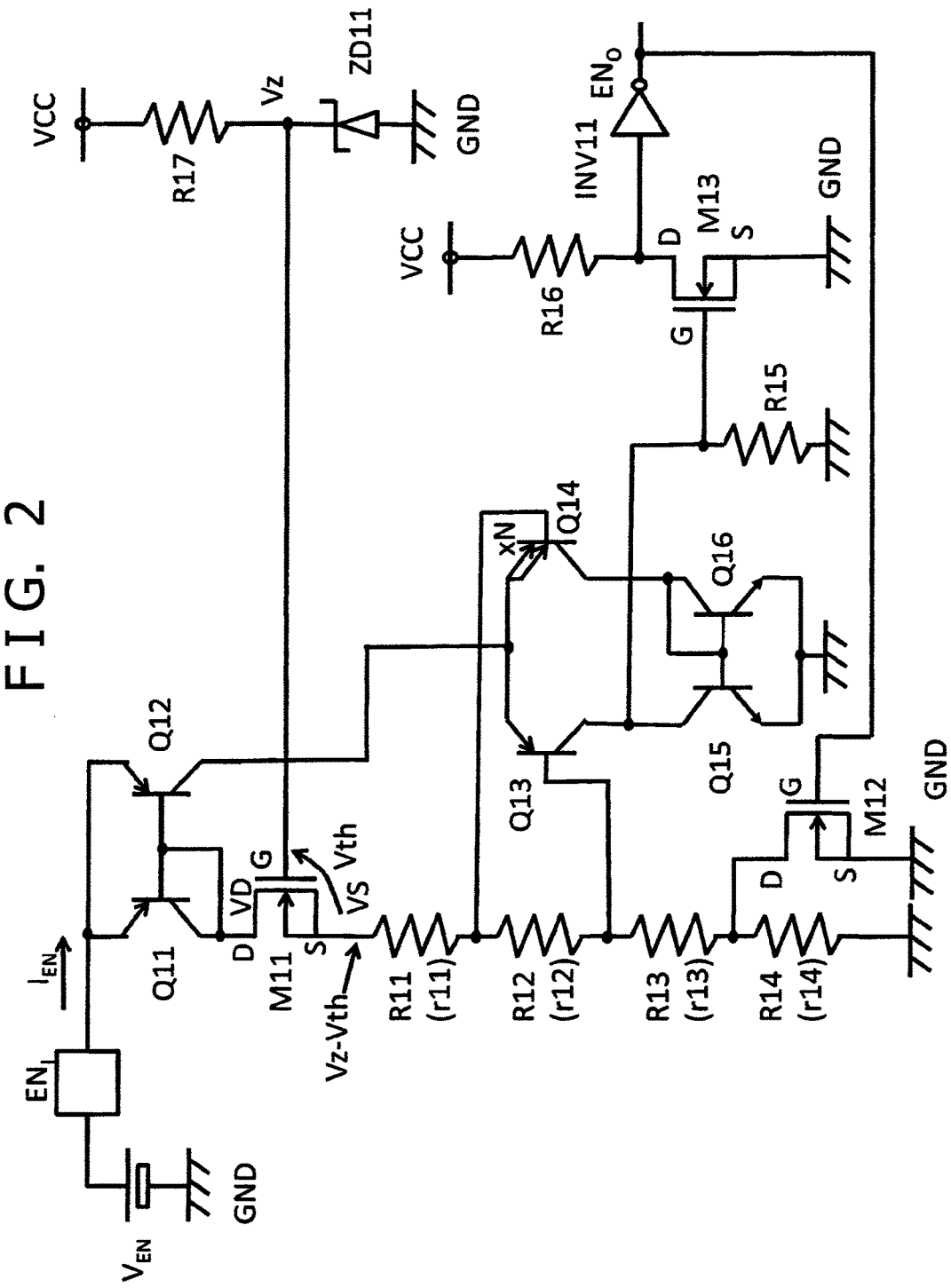
FIG. 2 is a circuit diagram illustrating an example of the configuration depicted in FIG. 1.

FIG. 2 is a detailed circuit diagram illustrating an example of the configuration depicted in the block diagram of FIG. 1. The enable signal generation circuit depicted in FIG. 2 is configured so that, from the enable input terminal ENI toward the ground potential GND, a current mirror circuit formed of bipolar transistors Q11 and Q12, a drain-source conduction path of an N-channel MOS transistor M11, and a reference voltage generation circuit formed of resistors R11 to R14 are connected in the order named.

The enable input terminal ENI is connected to the emitter of the bipolar transistor Q11 and to the emitter of the bipolar transistor Q12. The base and collector of the bipolar transistor Q11, the base of the bipolar transistor Q12, and the drain D of the MOS transistor M11 are connected. The source S of the MOS transistor M11 and one end of the resistor R11 are common connected. The other end of the resistor R11, one end of the resistor R12, and the base of a bipolar transistor Q14 are connected. The other end of the resistor R12, one end of the resistor R13, and the base of a bipolar transistor Q13 are connected. The other end of the resistor R13, one end of the resistor R14, and the drain D of a MOS transistor M12 are connected. The other end of the resistor R14 is connected to the ground potential GND. The source of the MOS transistor M12 is connected to the ground potential GND. An enable detection circuit is formed by allowing the collector of the bipolar transistor Q12, the emitter of the bipolar transistor Q13, and the emitter of the bipolar transistor Q14 to be common connected to form a differential configuration. The collector of the bipolar transistor Q13, the collector of a bipolar transistor Q15, one end of a resistor R15, and the gate of a MOS transistor M13 are common connected. The collector of the bipolar transistor Q14, the base of the bipolar transistor Q15, and the collector and base of a bipolar transistor Q16 are connected. The emitter of the bipolar transistor Q15 and the emitter of the bipolar transistor Q16 are connected to the ground potential GND. The other end of the resistor R15 is common connected to the ground potential GND. The source S of the MOS transistor M13 is connected to the ground potential GND. One end of a resistor R16 is connected to the power supply voltage VCC. The other end of the resistor R16, the drain D of the MOS transistor M13, and the input of an inverter INV11 are connected. The output of the inverter INV11 and the gate G of the MOS transistor M12 are connected. One end of a resistor R17 is connected to the power supply voltage VCC. The other end of the resistor R17 is connected to one end of a Zener diode ZD11 and to the gate G of the MOS transistor M11. The other end of the Zener diode ZD11 is connected to the ground potential GND.

When the enable input voltage VEN is applied to the enable input terminal ENI and the applied voltage is substantially equal to the emitter-base forward voltage of the bipolar transistor Q11, the consumption current IEN begins to flow. The reason is that the current mirror circuit formed of the bipolar transistors Q11 and Q12 starts operating. When the power supply voltage VCC is adequately given to the Zener diode ZD11 and the MOS transistor M11 is on, the total resistance value rTotal between the enable input terminal ENI and the ground potential GND is substantially expressed by the following equation:

$$rTotal = (r11 + r12 + r13 + r14)$$

Here, the following relationship is established between the drain voltage VD and source voltage VS of the MOS transistor M11 and the enable input voltage VEN:

$$VD = (VEN - Vf), VD = VS$$

The consumption current IEN is two times the current flowing in the bipolar transistor Q11. The reason is that the same magnitude of current flows in the bipolar transistor Q12, which forms the current mirror circuit. The consumption current IEN is expressed by the following equation:

$$IEN = 2 \times (VEN - Vf)/rTotal$$

However, the bipolar transistors Q11 and Q12 need not always be of the same size. When the bipolar transistors Q11 and Q12 differ in size, the flowing current is not set to twofold, but is set in accordance with the size ratio.

When the enable input voltage VEN is further increased, the enable output terminal ENO goes HIGH H, the MOS transistor M12 turns on, and the resistor R14 shorts. The consumption current IEN is then expressed by the following equation:

$$IEN = 2 \times (VEN - Vf)/(r11 + r12 + r13)$$

Here, when the enable input voltage VEN is increased to (Vz−Vth+Vf) in a situation where the threshold voltage between the gate G and source S of the MOS transistor M11 is Vth, the voltage applied to the gate G is Vz, and the emitter-base forward voltage of the bipolar transistor Q11 is Vf, the source voltage VS of the MOS transistor M11 is clamped to (Vz−Vth), and the consumption current IEN is expressed as follows:

$$IEN = 2 \times (Vz - Vth)/(r11 + r12 + r13)$$

The dependence of the consumption current IEN on the enable input voltage VEN can be suppressed.

Here, when the enable input voltage VEN applied when the enable output terminal ENO goes HIGH H is a first reference voltage VEN1 and the above-mentioned voltage (Vz−Vth+Vf) is a third reference voltage VEN3, the third reference voltage VEN3 needs to satisfy the following equation:

$$VEN3 = Vz - Vth + Vf > VEN1$$

The reason is that the enable output terminal ENO cannot go HIGH H if the above equation is not satisfied. A second reference voltage VEN2 exists separately from the third reference voltage VEN3. The second reference voltage VEN2 will be described later.

Figure 3A:
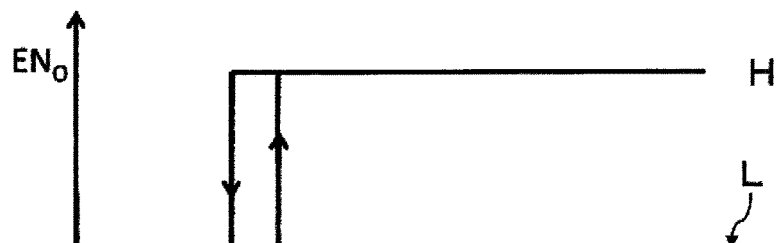
FIGS. 3A, 3B and 3C are diagrams illustrating an enable input voltage, various sectional voltages, and consumption current in a circuit illustrated in FIG. 2.
Figure 3B:
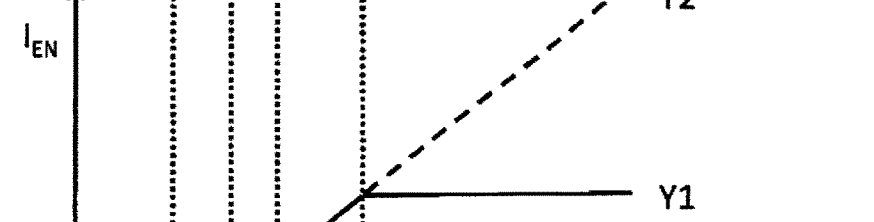
Figure 3C:
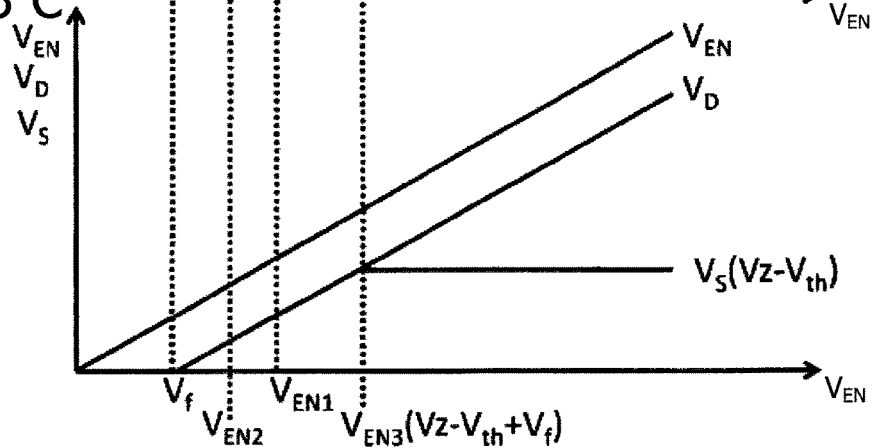

FIGS. 3A, 3B and 3C relate to the enable signal generation circuit depicted in FIG. 2 and illustrate the relationships between the enable input voltage VEN, the consumption current IEN of the enable input terminal ENI, the drain voltage VD and source voltage VS of the MOS transistor M11, and the enable output terminal ENO.

FIG. 3A illustrates the relationship between the enable output terminal ENO and the enable input voltage VEN. When the enable input voltage VEN exceeds the first reference voltage VEN1, the output generated from the enable output terminal ENO is HIGH H. As illustrated in FIG. 3A, when the enable input voltage VEN is decreased below the second reference voltage VEN2 after the enable output terminal ENO is made HIGH H, the enable output terminal ENO goes LOW L. That is to say, FIG. 3A depicts hysteresis characteristics where the voltage at which switching between HIGH H and LOW L occurs varies depending on whether the enable input voltage VEN is increased or decreased. Such hysteresis characteristics are generated when the MOS transistor M12 turns on and off.

If, in a situation where the enable detection circuit does not have hysteresis, noise enters the enable input terminal ENI at the moment at which the enable output terminal ENO is switched from LOW L to HIGH H, the enable output terminal ENO may momentarily go LOW L although it should remain HIGH H, or conversely, the enable output terminal ENO may momentarily go HIGH H although it should remain LOW L. The threshold value generally has hysteresis in order to avoid such an erroneous operation.

The description now returns to FIG. 2 in order to determine the first reference voltage VEN1 and second reference voltage VEN2 depicted in FIG. 3A.

Referring to FIG. 2, the emitter area ratio between the bipolar transistors Q13 and Q14, which are arranged in a differential configuration to form the enable detection circuit, is set to 1:N (N is a natural number of equal to or greater than 1). This generates an offset voltage Voffset of VTlnN. Here, thermal voltage VT=KT/q where q is the electrical charge of electrons, K is the Boltzmann constant, and T is an absolute temperature. It is known that the thermal voltage VT is approximately 26 mV at a normal temperature. Referring to FIG. 2, the enable output terminal ENO outputs a HIGH H when the first reference voltage VEN1 satisfies Equation (1).

$$VTlnN \leq (VEN1 - Vf) \times r12/rTotal \tag{1}$$

The enable detection circuit depicted in FIG. 2 is formed of bipolar transistors. However, the bipolar transistors Q13 and Q14 may be replaced by MOS transistors. When the bipolar transistors Q13 and Q14 are replaced by MOS transistors, the gate width and gate length should be adjusted so that the gate-source threshold voltages of the two MOS transistors differ from each other.

When the enable output terminal ENO goes HIGH H, the MOS transistor M12 turns on and the resistor R14 shorts. Thus, the enable output terminal ENO outputs a LOW L when the second reference voltage VEN2 satisfies Equation (2).

$$VTlnN \geq (VEN2 - Vf) \times r12/(r11 + r12 + r13) \tag{2}$$

Here, let us assume that the following equations are established:

$$V1 = (VEN1 - Vf), V2 = (VEN2 - Vf)$$

Then, the following equation is obtained from Equations (1) and (2):

$$V1 \geq V2(RTotal/(r11 + r12 + r13))$$

As rTotal/(r11+r12+r13)>1, V1>V2.

If V1=(VEN1−Vf) and V2=(VEN2−Vf), VEN1>VEN2.

This indicates that a hysteresis comparator is formed.

Further, from the above equation, the first reference voltage VEN1 and the second reference voltage VEN2 are respectively expressed by Equations (3) and (4):

$$VEN1 = VTlnN \times rTotal/r12 + Vf \tag{3}$$

$$VEN2 = VTlnN \times (r11 + r12 + r13)/r12 + Vf \tag{4}$$

When the second reference voltage VEN2 is expressed by using the first reference voltage VEN1 in accordance with Equations (3) and (4), Equation (5) is obtained:

$$VEN2 = VEN1 - (r14/r12)VTlnN \tag{5}$$

Note that the resistance value r14 in Equation (5) is the resistance value of the resistor R14. However, the resistance value r14 is equal to a value that is obtained by subtracting the resistance value (r11+r12+r13) from the total resistance value rTotal. Therefore, Equation (5) can be used as a substitute.

As is obvious from Equation (5), the difference between the first reference voltage VEN1 and the second reference voltage VEN2 is set in accordance with a predefined relationship. This increases the accuracy of hysteresis characteristics.

In an embodiment of the present invention, the bipolar transistors are arranged in a differential configuration so that an offset voltage is generated between the bipolar transistors. However, an alternative setup may be used to provide the MOS transistors with different threshold voltages. When the offset voltage is to be generated by the MOS transistors, either the gate width or gate length of the two MOS transistors should be adjusted.

FIG. 3B illustrates the relationship between the consumption current IEN of the enable input terminal ENI and the enable input voltage VEN. A characteristic Y1 is provided by the present invention. A characteristic Y2 represents a case where the present invention is not fully applied. Both the characteristic Y1 and the characteristic Y2 are such that the consumption current IEN increases in proportion to the enable input voltage VEN until the third reference voltage VEN3 (Vz−Vth+Vf) is reached. As is obvious from the characteristic Y1 to which the present invention is applied, when the enable input voltage VEN exceeds the third reference voltage VEN3, the consumption current IEN remains substantially constant, indicating that the power consumption is inhibited from being increased by an increase in the consumption current IEN. Meanwhile, as is obvious from FIG. 3B, the characteristic Y2 to which the present invention is not applied is such that the consumption current IEN increases in proportion to the enable input voltage VEN, indicating that the power consumption is not inhibited from being increased.

FIG. 3C illustrates the relationship between the drain voltage VD, the source voltage VS, and the enable input voltage VEN. As indicated in FIG. 3C, before the third reference voltage VEN3 is exceeded, the drain voltage VD of the MOS transistor M11 is as expressed by the equation VD=(VEN−Vf) and the source voltage VS of the MOS transistor M11 is as expressed by the equation VS=VD. Subsequently, when the third reference voltage VEN3 is exceeded, the equation VS=(Vz−Vth) is established.

Figure 4:
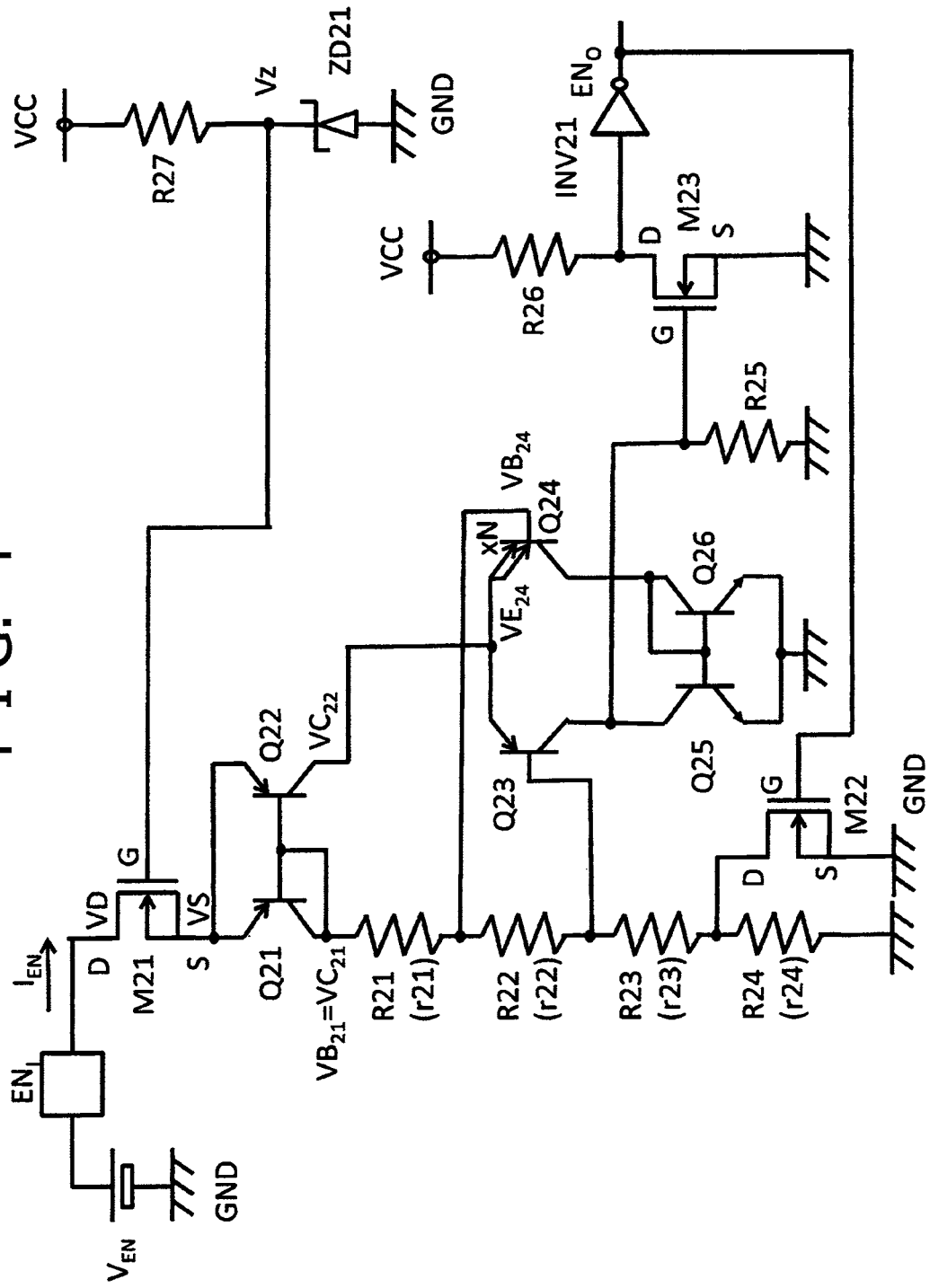
FIG. 4 is another circuit diagram illustrating the exemplary configuration depicted in FIG. 1.

FIG. 4 is a circuit diagram illustrating another embodiment of the present invention. The enable signal generation circuit depicted in FIG. 4 is configured so that, from the enable input terminal ENI toward the ground potential GND, a drain-source conduction path of an N-channel MOS transistor M21, transistors Q21 and Q22 forming a current mirror circuit, and a reference voltage generation circuit formed of resistors R21 to R24 are connected in the order named.

The enable signal generation circuit depicted in FIG. 4 differs from the enable signal generation circuit depicted in FIG. 2 in that the current mirror circuit formed of bipolar transistors Q21 and Q22 is not directly connected to the enable input terminal ENI, but is connected to the source S of the MOS transistor M21. When this circuit configuration is employed, a relatively high enable input voltage VEN is not applied to the bipolar transistors Q21 and Q22. Therefore, the circuit can be formed of low-breakdown-voltage transistors.

However, if the power supply voltage VCC is not sufficiently high, the emitter-collector voltage of the bipolar transistor Q22 may not be adequately obtained. Therefore, the magnitude of the power supply voltage VCC should be taken into consideration. If, for example, the gate-source threshold voltage Vth of the MOS transistor M21 is assumed to be 0.7 V in a situation where the power supply voltage VCC is approximately 2 V, the source voltage VS of the MOS transistor M21 is approximately as follows:

VS=VCC−Vth=2.0−0.7=1.3 [V]

Thus, the base voltage VB21 and collector voltage VC21 of the bipolar transistor Q21 is approximately as follows:

VB21=VC21=1.3−0.7=0.6 [V]

If the resistor R21 causes a voltage drop of approximately 0.1 [V], the base voltage VB24 of the bipolar transistor Q24 is approximately as follows:

VB24=0.6−0.1=0.5 [V]

Thus, the emitter voltage VE24 of the bipolar transistor Q24 is approximately as follows:

VE24=0.5+0.7=1.2 [V]

In this instance, the emitter voltage VE22 of the bipolar transistor Q22=VS=1.3 [V] and the collector voltage VC22=VE24=1.2 [V], the emitter-collector voltage is not adequately obtained.

The clamp circuit uses a Zener diode in the present invention. However, it is recommended that the Zener diode have a low temperature coefficient substantially close to zero. In general, a Zener diode having a Zener voltage of approximately 5.2 V has the smallest temperature coefficient. It is therefore recommended that such a Zener diode be used in the presently proposed circuit.

If clamping to a voltage lower than in the presently proposed circuit is to be performed, available options are to use a Zener diode having a lower Zener voltage or use a series diode connection method. However, attention needs to be paid to the temperature coefficient. As the Zener diode has a negative temperature coefficient, it is necessary to consider that a clamp voltage decreases with an increase in temperature.

If clamping to a voltage higher than in the presently proposed circuit is to be performed, available options are to use a Zener diode having a higher Zener voltage or use a series diode connection method for a Zener diode. In either case, attention needs to be paid to the temperature coefficient. However, when a Zener diode is series-connected to a diode, it is conceivable that positive and negative temperature coefficients may cancel each other. Therefore, the use of this method is recommended. However, it is necessary to consider that the consumption current increases with an increase in the clamp voltage.

The present invention has been described on the assumption that a differential input section of an offset comparator is represented by a bipolar transistor. However, it is obvious that the same function can be implemented by a MOS transistor.

It is to be understood that the currently disclosed embodiments in all respects are only illustrative and not restrictive. The scope of the present invention is indicated by the appended claims rather than the foregoing description. All changes that come within the meaning and range of equivalency of the claims are to be embraced within their scope.

The present invention provides an enable signal generation circuit that greatly contributes to meeting the recent demand for power saving. Therefore, the present invention has very high industrial applicability.

The present invention contains subject matter related to that disclosed in Japanese Priority Patent Application JP 2016-196423 filed in the Japan Patent Office on Oct. 4, 2016, the entire content of which is hereby incorporated by reference.

What is claimed is:

1. An enable signal generation circuit comprising:
an enable input terminal arranged to receive an enable input voltage;
an enable detection circuit that determines whether the enable input voltage is higher than a first reference voltage, and then outputs an inverted signal; and
an output section that is connected to the enable detection circuit;
wherein the enable detection circuit is formed of at least two transistors arranged in a differential configuration, gives the two transistors offset voltages that provide different operating voltages, and causes the output section to output a signal based on the inverted signal.

2. The enable signal generation circuit according to claim 1, wherein, if the two transistors are bipolar transistors, the offset voltages are given in such a manner as to provide the two bipolar transistors with different emitter-base forward voltages.

3. The enable signal generation circuit according to claim 2, wherein the offset voltages are set in such a manner as to provide the bipolar transistors with different emitter areas.

4. The enable signal generation circuit according to claim 1, wherein, if the two transistors are metal-oxide semiconductor transistors, the offset voltages are given in such a manner as to provide the two metal-oxide semiconductor transistors with different gate-source threshold voltages.

5. The enable signal generation circuit according to claim 4, wherein the offset voltages are given in such a manner as to make the metal-oxide semiconductor transistors different in at least either gate width or gate length.

6. The enable signal generation circuit according to claim 1, wherein an N-channel metal-oxide semiconductor transistor and a reference voltage generation circuit are series-connected between the enable input terminal and a ground potential, the reference voltage generation circuit generating the first reference voltage; one control electrode of the two transistors is connected to a first circuit point at which a first voltage is obtained from the reference voltage generation circuit; and the other control electrode of the two transistors is connected to a second circuit point at which a second voltage is obtained.

7. The enable signal generation circuit according to claim 6, wherein, if the enable input voltage exceeds the first reference voltage and then decreases, the enable detection circuit outputs an inverted signal at a second reference voltage, the second reference voltage being lower than the first reference voltage.

8. The enable signal generation circuit according to claim 7, wherein, from the enable input terminal toward the ground potential, a current mirror circuit, a drain-source conduction path of the N-channel metal-oxide semiconductor transistor, and the reference voltage generation circuit are connected in the order named.

9. The enable signal generation circuit according to claim 7, wherein, from the enable input terminal toward the ground potential, a drain-source conduction path of the N-channel metal-oxide semiconductor transistor, a current mirror circuit, and the reference voltage generation circuit are connected in the order named.

10. The enable signal generation circuit according to claim 8, wherein the reference voltage generation circuit is formed of a series-connected body obtained by connecting at least two resistors in series.

11. The enable signal generation circuit according to claim 10, wherein one end of a resistor of the series-connected body is connected to the first circuit point; and where the other end of the resistor is connected to the second circuit point.

12. The enable signal generation circuit according to claim 7, wherein the first reference voltage and the second reference voltage are generated by changing the connection of the series-connected body.

13. The enable signal generation circuit according to claim 10, wherein an input transistor of the current mirror circuit is connected to a conduction path between the enable input terminal and the drain of the N-channel metal-oxide semiconductor transistor; and a mirror current generated by an output transistor of the current mirror circuit is set as a load current for the two transistors forming the enable detection circuit.

14. The enable signal generation circuit according to claim 7, wherein a third reference voltage is applied to the gate of the N-channel metal-oxide semiconductor transistor, the third reference voltage being fixed; and when the enable input voltage reaches the third reference voltage, a current flowing between the drain and source of the N-channel metal-oxide semiconductor transistor is made constant by the third reference voltage.

\* \* \* \* \*